(12) United States Patent
Haas et al.

(10) Patent No.: US 8,136,020 B2
(45) Date of Patent: Mar. 13, 2012

(54) FORWARD ERROR CORRECTION CODEC

(75) Inventors: Wally Haas, Mount Pearl (CA); Chuck Rumbolt, St. John's (CA)

(73) Assignee: Altera Canada Co., Halifax, NS (CA)

(*) Notice: Subject to any disclaimer, the term of this patent is extended or adjusted under 35 U.S.C. 154(b) by 1139 days.

(21) Appl. No.: 11/987,300

(22) Filed: Nov. 29, 2007

(65) Prior Publication Data

US 2009/0077448 A1 Mar. 19, 2009

Related U.S. Application Data

(60) Provisional application No. 60/994,314, filed on Sep. 19, 2007.

(51) Int. Cl.
*H03M 13/00* (2006.01)

(52) U.S. Cl. .......... 714/782; 714/752

(58) Field of Classification Search .......... 714/872, 714/746, 752, 755, 776, 756, 702, 786
See application file for complete search history.

(56) References Cited

U.S. PATENT DOCUMENTS

| | | | |
|---|---|---|---|
| 5,537,429 A | 7/1996 | Inoue | |
| 6,185,715 B1 | 2/2001 | Fang et al. | |
| 6,622,277 B1 * | 9/2003 | Ramanujam et al. | 714/755 |
| 6,658,605 B1 | 12/2003 | Yoshida et al. | |
| 7,032,154 B2 * | 4/2006 | Kidorf et al. | 714/755 |
| 7,096,403 B2 | 8/2006 | Seki | |
| 7,246,294 B2 | 7/2007 | Kauschke et al. | |
| 7,289,530 B1 | 10/2007 | Yuan et al. | |
| 2002/0056064 A1 * | 5/2002 | Kidorf et al. | 714/755 |
| 2002/0166091 A1 * | 11/2002 | Kidorf et al. | 714/752 |
| 2003/0106009 A1 | 6/2003 | Jarchi et al. | |
| 2004/0268209 A1 | 12/2004 | Srivastava et al. | |

OTHER PUBLICATIONS

International Telecommunication Union: Telecommunication Standardization Sector (ITU-T). "Forward error correction for high bit-rate DWDM submarine systems." G.975.1 (Feb. 2004).

* cited by examiner

*Primary Examiner* — Phung M Chung
(74) *Attorney, Agent, or Firm* — Ropes & Gray LLP

(57) ABSTRACT

A present invention discloses a method for performing forward error correction (FEC) in long-haul submarine transmission systems. Data is encoded at a transmitter by serially concatenated, binary Bose-Ray-Chaudhuri-Hocquenghem (BCH) error correcting codes. The invention encodes a stream of data employing a plurality of serially concatenated, binary Bose-Ray-Chaudhuri-Hocquenghem (BCH) error correcting codes, arranging data into a frame of parallel data blocks (the outer frame) with redundancy bits appended by a BCH(3896, 3824) code; the outer frame is then interleaved to produce a frame of serial data blocks (the intermediate frame); and the final frame (the inner frame) is produced by appending the redundancy bits of the BCH(2040, 1952) code to the intermediate frame. The data, once encoded, is transmitted across a datapath and decoded at the receiver.

20 Claims, 2 Drawing Sheets

Intermediate Frame Format

| BCH (3896,3824) #1 (3896 bits) | 8 dummy bits | BCH (3896,3824) #2 (3896 bits) | 8 dummy bits | BCH (3896,3824) #3 (3896 bits) | 8 dummy bits | ... | BCH (3896,3824) #32 (3896 bits) | 8 dummy bits |
|---|---|---|---|---|---|---|---|---|

Figure 1: Outer Frame Format
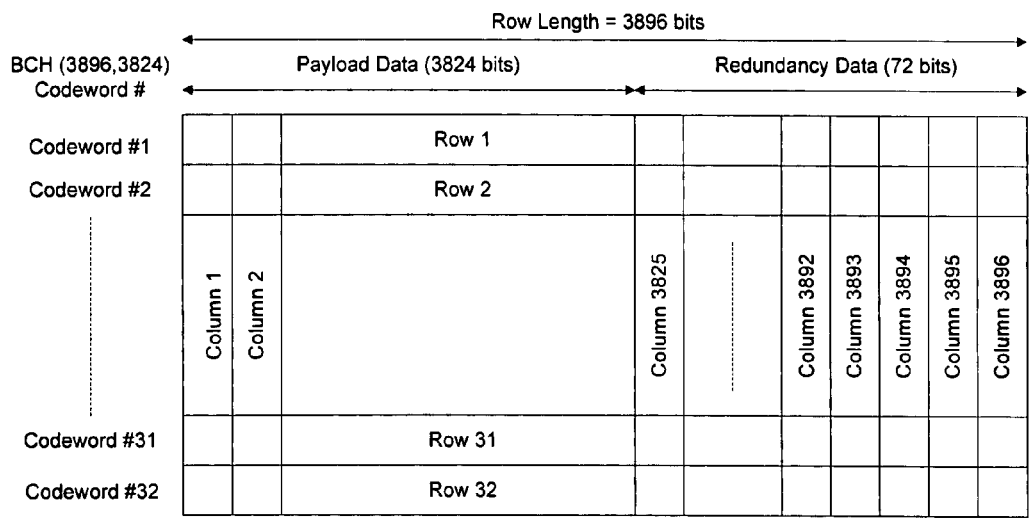
Figure 2: Intermediate Frame Format
| BCH (3896,3824) #1 (3896 bits) | 8 dummy bits | BCH (3896,3824) #2 (3896 bits) | 8 dummy bits | BCH (3896,3824) #3 (3896 bits) | 8 dummy bits | ... | BCH (3896,3824) #32 (3896 bits) | 8 dummy bits |
|---|---|---|---|---|---|---|---|---|
Figure 3: Inner Frame Format
| Intermediate Frame (124928 bits) | BCH(2040, 1952) Redundancy (5632 bits) |
|---|---|

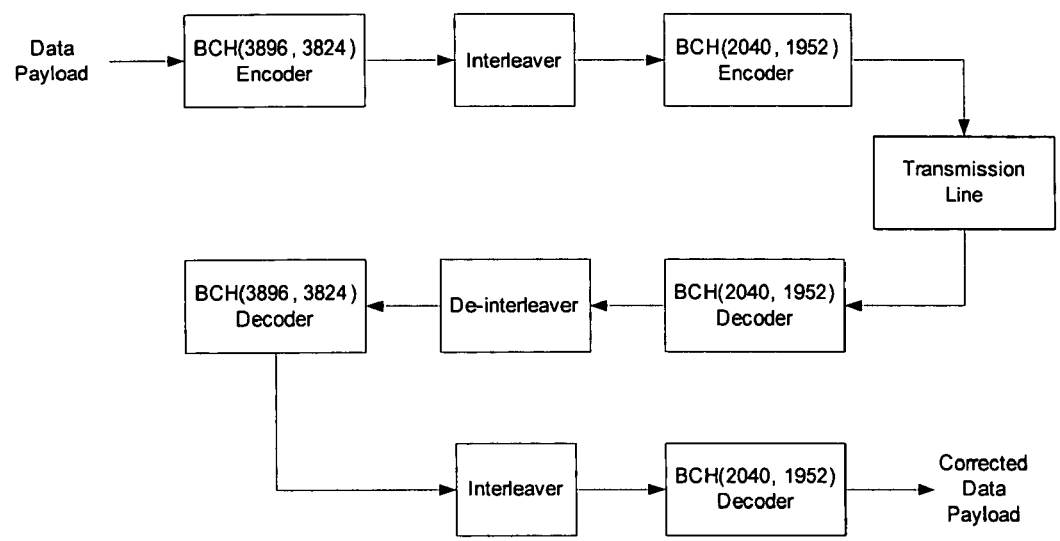
Figure 4 : CODEC

FORWARD ERROR CORRECTION CODEC

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

PARENT CASE TEXT

Priority is claimed to US Provisional Application No. 60/994,314, filed Sep. 19, 2007.

BACKGROUND OF THE INVENTION

1. Technical Field of the Invention

The present invention discloses concatenated BCH codes for a forward error correction coder and decoder (CODEC) for use in digital communication systems.

2. Background of the Invention

Long-distance digital communication systems, such as optical submarine cable systems, are responsible for the transmission of significant amounts of data. This data is transmitted across great distances, often from continent to continent. During transmission, data can become corrupted from noise within transmission channels, faults in transmission or receiving devices, or data errors from reading to and writing from an elastic store. Therefore, forward error correction (FEC) is employed to minimize the error probability of the data being transmitted.

Claude Shannon first suggested a maximum possible channel throughput which developed into a theorem of error correction describing the addition of redundant data to payload data for the correction of errors from channel noise or interference during transmission. Such forward error correction increases the reliability of transmitted data by encoding a block of payload data with redundant data bits through an algorithm generated at the transmitter, which allows a decoder to determine if an error has occurred at the receiver. The decoder employs the code generated by the encoder to identify what information, if any, has been corrupted by noise or interference during transmission, and the decoder can correct these errors.

Two common methods of FEC coding are block coding and convolutional coding; the present invention employs the former, where a codeword (n) is the block of symbols that carries the information symbols (k) and the redundant symbols (r). Each symbol is comprised of data words of m bits. In block coding, where n−k=r, redundancy symbols (r) are added to information symbols (k), originating from the encoder at the transmitter, and the redundancy symbols are utilized by the decoder at the receiver to correct transmission errors. Generally, errors in long-distance data transmission are uniformly random. Such errors can be remedied by interleaving bits for transmission; therefore, errors are scattered across transmission frames so that de-interleaving the data shows random, individualized errors which are easy to detect and correct.

While increasing the number of bits in a symbol may increase the ability for FEC to correct errors, it also increases circuit size and the amount of power required. Therefore, more efficient FEC can be accomplished by concatenated codes, which combine two or more FEC codes, physically layered as an inner and an outer code, such that the inner code comprises an encoder or decoder and the outer code comprises an encoder or decoder.

The present invention is comprised of a serial concatenation of binary Bose-Ray-Chaudhuri-Hocquenghem (BCH) codes. BCH codes are cyclic, error-correcting, digital codes of varying length which are able to correct errors. BCH codes typically employ a polynomial over a finite field, and a BCH codeword consists of a polynomial that is a multiple of the generator polynomial, which specifies a maximum length Linear Feedback Shift Register (LFSR). At the transmitter, the outer code encodes the data, followed by the inner code. Such concatenated codes are desirable as they are effective against both random and burst errors: first, the inner code decodes the data at the receiver; then the outer code decodes the same data. Employing such iterative decoding allows the outer code to correct any remaining errors not corrected by the inner code. The redundancy required for such error correction is attained by the addition of extra bits, or redundancy bits, to blocks of information, and transmitting the combined bits at a higher data rate.

Unlike some prior art, the present invention does not intend to match the RS(255,239) code standardized by ITU-T G.975.1, and requires less overhead. In addition, unlike some prior art, the present invention does not necessarily reserve any number of redundancy bits for predetermined tasks, but allows the redundancy bits to be unrestricted and available for use as needed. The present invention specifically employs BCH codes, differing from some prior art which may also employ Reed-Solomon, Reed-Muller, Cyclic Redundancy Check, Hamming, Viterbi Golay, Turbo, Fire Turbo, or other error correction codes. The present invention also relies upon the specific BCH(3896, 3824) and BCH(2040, 1952) codes.

SUMMARY OF THE INVENTION

The present invention discloses a concatenated forward error correction (FEC) code, for use in long-haul digital communication systems. The invention is comprised of at least two forward error correction codes, concatenated to provide a high-performance, efficient algorithm.

Data are encoded by an encoder with an error correction code at a transmitter, before the data is transmitted across a network to a receiver. Upon arrival across a datapath, said data are decoded by a decoder at a receiver. The decoder is able to decode said data, detect transmission errors from channel noise or interference, and correct said transmission errors utilizing the forward error correction code.

The advantages of the present invention are fully described in the following detailed description, drawings and claims. However, the following illustrative embodiment of the invention is intended for explanative purposes only, demonstrating the present invention pertaining to OTN, and is not intended to limit the scope of the present invention, which is applicable to multiple transmission systems, such as SONET, SDH and other methods of communications.

DESCRIPTION OF THE DRAWINGS

FIG. 1 discloses the outer frame format of the present invention. The outer frame format is comprised of the 122368 payload bits of the Optical Data Unit (ODU) frame, which are mapped into 32 groups and encoded with 32 BCH(3896, 3824) codes.

FIG. 2 discloses the intermediate frame format of the present invention. The intermediate frame format is produced by interleaving the data encoded by the BCH(3896, 3824) outer code. This serializes the BCH(3896, 3824) codewords so that they are encoded as if in a serial bit stream. The intermediate frame is 124928 bits in length and is mapped into 64 groups of 1952 bits. The frame is encoded using a 64 bit interleaved mapping.

FIG. 3 discloses the inner frame format of the present invention. The inner frame is produced by appending 5632 redundancy bits (64 codes*88 redundancy bits) to the intermediate frame, from the 64 BCH(2040, 1952) codes. This creates an inner frame length of 130560 bits. The redundancy bits are appended by having the first redundancy bit of BCH(2040, 1952) #1 mapped to inner[124928], the first redundancy bit of BCH(2040, 1952) #2 mapped to inner[124929], until the last redundancy bit of BCH(2040, 1952) #32 is mapped to inner[130559].

FIG. 4 discloses the CODEC (encoding and decoding) algorithm of the present invention, where a serial concatenation of two binary BCH codes provides a method of forward error correction for transmission of data across a digital communication network. First, the payload is transmitted on the datapath through the BCH(3896, 3824) encoder at the transmitter, through the interleaver and into the BCH(2040, 1952) encoder. The data then travels through a transmission line and into the BCH(2040,1952) decoder, into a de-interleaver, and into a BCH(3896, 3824) decoder. The data is then sent through a second interleaver and a second BCH(2040, 1952) decoder before it arrives at the receiver with corrected payload data.

DETAILED DESCRIPTION OF AN ILLUSTRATIVE EMBODIMENT OF THE INVENTION

The present invention discloses a forward error correction algorithm which aims to maintain the data rate set forth in the ITU-T G.709/Y.1331 standard, while providing enhanced coding gain, or an "improvement of received optical sensitivity by FEC, without considering penalty by bit rate increas [e]" (ITU-T G.975.1). The invention is intended to improve upon the ITU-T G.975.1 Annex 4 code which uses a BCH (2040, 1952) inner code and a RS(1023,1007) outer code, through the use of at least two BCH codes. In a uniform channel, two or more BCH codes prove most efficient, requiring the use of a smaller number of redundancy bits. The code provided in the present invention employs a channel model similar to an Additive White Gaussian Noise (AWGN) channel model, where burst errors within the frame occur at a lower probability than random errors.

In an illustrative embodiment of the invention employs a serial concatenation of two binary BCH codes. Concatenated codes are comprised of a stronger inner code and a weaker outer code, with an interleaver connecting the inner and outer codes together. This method of interleaving spreads burst errors across different blocks of data, increasing the ability for error-correction.

In the present invention, the outer code is a BCH(3896, 3824), shortened from the BCH(4095, 4023) parent code. It operates on an m=12 Galois field with t=6. The codeword has 3824 data bits and 72 redundancy bits, and the improved code can correct any 6 errors that occur within said codeword. The outer code's primitive binary polynomial is:

$$p(x)=x^{12}+x^6+x^4+x+1$$

The inner code is a BCH(2040, 1952), shortened from the BCH(2047, 1959) parent code. It operates on an m=11 Galois field with t=8. The codeword has 1952 data bits and 88 redundancy bits, and the code can correct any 8 errors that occur within the codeword. The inner code's primitive binary polynomial is:

$$p(x)32\, x^{11}+x^2+1$$

The inner and outer codes are interleaved to orthogonally map the data for higher coding gain. In addition, iterative decoding is used, as the outer code can correct any errors not corrected by the inner code. The present invention also implements second iteration of the inner BCH(2040, 1952) code to produce, in essence, a triple concatenated BCH: the coding gain of the present invention is the result of three levels of decoding, providing lower transmission-error rates.

There are 122368 payload bits in an Optical Data Unit (ODU) frame. In the outer frame format (see FIG. 1), these payload bits are mapped into 32 groups and encoded with 32 BCH(3896, 3824) codes. In an illustrative embodiment of the invention, the data is encoded by having odu[0-15] fed to BCH(3896, 3824) #1, odu[16-31] fed to BCH(3896, 3824) #2, odu[32-47] fed to BCH(3896, 3824) #3, and so on, until odu[240-255] is fed to BCH(3896, 3824) #16; the process is then reiterated so that data encoded by odu[256-271] is fed to BCH(3896, 3824) #1, odu[272-287] is fed to BCH(3896, 3824) #2, odu[288-303] is fed to BCH(3896, 3824) #3, and so on, until odu[496-511] is fed to BCH(3896, 3824) #16. This process repeats until the first half of the data has been encoded. The second half of the data is encoded by having odu[61184-61199] fed to BCH(3896, 3824) #17, odu [61200-61215] fed to BCH(3896,3824) #18, odu[61216-61231] fed to BCH(3896,3824) #19, and so on, until odu[61423-61433] is fed to BCH(3896, 3824) #32; the process is then reiterated so that data encoded by odu[61434-61449] is fed to BCH (3896, 3824) #16, odu[61450-61465] is fed to BCH(3896, 3824) #17, odu[61466-61481] is fed to BCH(3896, 3824) #18, and so on, until odu[61674-61689] is fed to BCH(3896, 3824) #32. This process repeats until the final group of data, odu[122352-122367] is fed to BCH(3896, 3824) #32.

After the data is encoded by the BCH (3896, 3824) outer code it is interleaved to produce the intermediate frame format (see FIG. 2). This serializes the BCH(3896, 3824) codewords so that they are transmitted as if in a serial bit stream. The intermediate frame is 124 928 bits in length and is mapped into 64 groups of 1952 bits. The frame is encoded using a 64 bit interleaved mapping: the first bit of the intermediate frame, int[0], is the first bit for BCH(2040, 1952) #1; int[1] is the first bit BCH(2040, 1952) #2; until int[124927] is the last bit BCH(2040, 1952) #64.

The inner frame (see FIG. 3) is created by appending 5632 redundancy bits (64 codes*88 redundancy bits) to the intermediate frame, from the 64 BCH(2040, 1952) codes. This creates an inner frame of length 130 560 bits. The redundancy bits are appended by having the first redundancy bit of BCH (2040, 1952) #1 mapped to inner[124928], the first redundancy bit of BCH(2040, 1952) #2 mapped to inner[124929], until the last redundancy bit of BCH(2040, 1952) #32 is mapped to inner[130559].

Once transmitted across a datapath, the encoded data is decoded in the reverse order in which it was encoded. First, the data is decoded using a BCH(2040,1952) decoder, wherein it attempts to correct any detected errors. The BCH (2040,1952) redundancy bits are removed while the remaining bits (the intermediate frame) are de-interleaved to produce the outer frame. The outer frame is then decoded using a BCH(3896,3824) decoder, wherein it attempts to correct any detected errors. Finally, the decoded outer frame is interleaved and the BCH(2040,1952) redundancy bits are appended to produce a decoded inner frame. This data is then decoded using a BCH(2040,1952) decoder, wherein it attempts to correct any detected errors.

The present invention improves upon the ITU-T G.975.1 Annex 4 code which uses a BCH(2040, 1952) inner code and a RS(1023,1007) outer code; the improvement comes from the BCH(3896, 3824) outer code which has the ability to correct for 196 errors in an OTN frame, as opposed to the 128 bit errors for the RS code given an AWGN error model. This results in a smaller, physically realizable code with similar gain.

References Cited

| U.S. patent Documents | | |
| --- | --- | --- |
| 7,246,294 | July 2007 | Kauschke, et al. |
| 7,096,403 | August 2006 | Seki |
| 6,658,605 | December 2003 | Yoshida, et al. |
| 6,622,277 | September 2003 | Ramanujam, et al. |
| 6,185,715 | February 2001 | Fang, et al. |
| 5,537,429 | July 1996 | Inoue |
| 20040268209 | December 2004 | Srivastava, Apoorv, et al. |
| 20020056064 | May 2002 | Kidorf, Howard D., et al. |

Other References
ITU-T G.975.1 (February 2004)

We claim:

1. An apparatus for performing forward error correction comprising:
a first encoder operable to:
encode input data using a first error correcting code, and arrange said encoded data into an outer frame, wherein the outer frame is a frame of parallel data blocks, and wherein the outer frame comprises appended redundancy bits corresponding to the first error correcting code;
an interleaver operable to interleave the outer frame to generate an intermediate frame comprising serial data blocks; and
a second encoder operable to append redundancy bits corresponding to a second error correcting code to the intermediate frame to generate an inner frame.

2. The apparatus of claim 1 further comprising:
a first decoder operable to:
correct errors in the inner frame by utilizing the redundancy bits of the second error correcting code, and remove the redundancy bits of the second error correcting code to generate a reconstructed intermediate frame;
a de-interleaver operable to de-interleave the reconstructed intermediate frame to generate a reconstructed outer frame; and
a second decoder operable to correct errors in the reconstructed outer frame by utilizing the redundancy bits of the first error correcting code and generate a decoded outer frame.

3. The apparatus of claim 2, wherein a second encoding using the second error correcting code is performed.

4. The apparatus of claim 2 further comprising circuitry operable to:
interleave the decoded outer frame;
generate a decoded inner frame by appending redundancy bits of the second error correcting code to the decoded outer frame;
detect errors in the decoded inner frame using the redundancy bits of the second error correcting code;
correct the detected errors to generate corrected data; and
output the corrected data.

5. The apparatus of claim 1, wherein the first error correcting code is an outer code that is shortened from a parent error correcting code.

6. The apparatus of claim 5, wherein the interleaver is further operable to perform the interleaving using orthogonal mapping for higher coding gain.

7. The apparatus of claim 1, wherein the first error correcting code is a Bose-Ray-Chaudhuri-Hocquenghem (BCH) BCH(3896, 3824) code.

8. The apparatus of claim 1, wherein the second error correcting code is a BCH(2040, 1952) code shortened from a BCH(2047, 1959) parent error correcting code.

9. The apparatus of claim 1, wherein the first encoder encodes the input data by mapping the input data into a plurality of groups and encoding each group using the first error correcting code.

10. A method for forward error correction, the method comprising:
encoding, using a first encoder, input data using a first error correcting code;
arranging, using the first encoder, said encoded data into an outer frame, wherein the outer frame is a frame of parallel data blocks, and wherein the outer frame comprises appended redundancy bits corresponding to the first error correcting code;
interleaving, using an interleaver, the outer frame to generate an intermediate frame comprising serial data blocks; and
appending, using a second encoder, redundancy bits corresponding to a second error correcting code to the intermediate frame to generate an inner frame.

11. The method of claim 10 further comprising:
correcting errors, using a first decoder, in the inner frame by utilizing the redundancy bits of the second error correcting code;
removing, using the first decoder, the redundancy bits of the second error correcting code to generate a reconstructed intermediate frame;
de-interleaving, using a de-interleaver, the reconstructed intermediate frame to generate a reconstructed outer frame; and
correcting errors in the reconstructed outer frame, using a second decoder, by utilizing the redundancy bits of the first error correcting code to generate a decoded outer frame.

12. The method of claim 11, wherein a second encoding using the second error correcting code is performed.

13. The method of claim 11 further comprising:
interleaving, using circuitry, the decoded outer frame;
generating, using the circuitry, a decoded inner frame by appending redundancy bits of the second error correcting code to the decoded outer frame;
detecting, using the circuitry, errors in the decoded inner frame using the redundancy bits of the second error correcting code;
correcting, using the circuitry, the detected errors to generate corrected data; and
outputting, using the circuitry, the corrected data.

14. The method of claim 10, wherein the first error correcting code is an outer code that is shortened from a parent error correcting code.

15. The method of claim 14, wherein the interleaver is further operable to perform the interleaving using orthogonal mapping for higher coding gain.

16. The method of claim 10, wherein the first error correcting code is a Bose-Ray-Chaudhuri-Hocquenghem (BCH) BCH(3896, 3824) code.

17. The method of claim 10, wherein the second error correcting code is a BCH(2040, 1952) code shortened from a BCH(2047, 1959) parent error correcting code.

18. The method of claim 10, wherein the first encoder encodes the input data by mapping the input data into a plurality of groups and encoding each group using the first error correcting code.

19. A method for forward error correction, the method comprising:
   encoding, using a first encoder, input data using a first error correcting code;
   arranging, using the first encoder, said encoded data into an outer frame, wherein the outer frame is a frame of parallel data blocks, and wherein the outer frame comprises appended redundancy bits corresponding to the first error correcting code;
   interleaving, using an interleaver, the outer frame to generate an intermediate frame comprising serial data blocks;
   appending, using a second encoder, redundancy bits corresponding to a second error correcting code to the intermediate frame to generate an inner frame;
   correcting, using decoding circuitry, errors in the inner frame by utilizing the redundancy bits of the second error correcting code;
   removing, using the decoding circuitry, the redundancy bits of the second error correcting code to generate a reconstructed intermediate frame;
   de-interleaving the reconstructed intermediate frame, using the decoding circuitry, to generate a reconstructed outer frame; and
   correcting errors in the reconstructed outer frame, using the decoding circuitry, by utilizing the redundancy bits of the first error correcting code to generate a decoded outer frame.

20. The method of claim 19 further comprising:
   interleaving the decoded outer frame;
   generating a decoded inner frame by appending redundancy bits of the second error correcting code;
   detecting errors in the decoded inner frame using the redundancy bits of the second error correcting code;
   correcting the detected errors to generate corrected data; and
   outputting corrected data.

* * * * *